United States Patent
Choi et al.

(10) Patent No.: US 7,869,255 B2
(45) Date of Patent: *Jan. 11, 2011

(54) NON-VOLATILE MEMORY DEVICES, METHOD OF MANUFACTURING AND METHOD OF OPERATING THE SAME

(75) Inventors: Byung Yong Choi, Seoul (KR); Choong Ho Lee, Gyeonggi-do (KR); Kyu Charn Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 453 days.

This patent is subject to a terminal disclaimer.

(21) Appl. No.: 11/943,657

(22) Filed: Nov. 21, 2007

(65) Prior Publication Data

US 2008/0123399 A1 May 29, 2008

(30) Foreign Application Priority Data

Nov. 24, 2006 (KR) ...................... 10-2006-0116864

(51) Int. Cl.
*G11C 11/00* (2006.01)
(52) U.S. Cl. ........................ 365/148; 365/100; 365/163; 257/E21.35; 438/135
(58) Field of Classification Search .................. 365/46, 365/94, 100, 129, 148; 257/E21.35; 438/135
See application file for complete search history.

(56) References Cited

U.S. PATENT DOCUMENTS

| | | | |
|---|---|---|---|
| 7,016,222 B2 * | 3/2006 | Morikawa | 365/158 |
| 7,057,922 B2 * | 6/2006 | Fukumoto | 365/158 |
| 7,602,633 B2 * | 10/2009 | Choi et al. | 365/148 |
| 2005/0064645 A1 * | 3/2005 | King | 438/217 |
| 2005/0269613 A1 * | 12/2005 | Li et al. | 257/295 |
| 2006/0108625 A1 * | 5/2006 | Lee et al. | 257/310 |
| 2007/0008773 A1 * | 1/2007 | Scheuerlein | 365/161 |
| 2008/0247219 A1 * | 10/2008 | Choi et al. | 365/148 |
| 2009/0027955 A1 * | 1/2009 | Koh et al. | 365/163 |

FOREIGN PATENT DOCUMENTS

| | | |
|---|---|---|
| KR | 593750 | 6/2006 |
| KR | 10-2006-0083368 A | 7/2006 |
| KR | 10-2006-0081003 A | 12/2006 |

* cited by examiner

*Primary Examiner*—Richard Elms
*Assistant Examiner*—Harry W Byrne
(74) *Attorney, Agent, or Firm*—Myers Bigel Sibley & Sajovec

(57) ABSTRACT

A non-volatile memory device includes a substrate having a recess thereon, a resistant material layer pattern in the recess, a lower electrode on the resistant material layer pattern in the recess, a dielectric layer, and an upper electrode formed on the dielectric layer. The resistant material layer pattern includes a material whose resistance varies according to an applied voltage. The dielectric layer is formed on the substrate, the resistant material layer pattern and the lower electrode. An upper electrode overlaps the resistant material layer pattern and the lower electrode. The applied voltage is applied to access the upper and lower electrodes to vary the resistance of the resistant material layer pattern.

21 Claims, 11 Drawing Sheets

NON-VOLATILE MEMORY DEVICES, METHOD OF MANUFACTURING AND METHOD OF OPERATING THE SAME

CROSS-REFERENCE TO RELATED APPLICATION

This application claims priority under 35 USC §119 to Korean Patent Application No. 2006-116864 filed on Nov. 24, 2006, the contents of which are herein incorporated by references in their entirety.

BACKGROUND OF THE INVENTION

1. Field of the Invention

The present invention relates to non-volatile memory devices. More particularly, the present invention relates to non-volatile memory devices including a material whose resistance varies according to an applied voltage.

2. Description of the Related Art

Non-volatile memory devices are generally divided into floating gate non-volatile memory devices and charge trapping non-volatile memory devices.

A unit cell of the floating gate type non-volatile memory device usually includes a tunnel oxide layer, a floating gate, a dielectric layer and a control gate that are formed on the semiconductor substrate. Charges may be injected into or emitted from the floating gate so that information may be stored in the floating gate non-volatile memory device.

A unit cell of the charge trapping non-volatile memory device usually includes a tunnel insulation layer, a charge trapping layer, a blocking insulation layer and an electrode that are formed on a semiconductor substrate. The tunnel insulation layer and the blocking insulation layer typically include a silicon oxide. The charge trapping layer typically includes a silicon nitride, and the electrode usually includes doped poly-silicon. Charges may be stored into or emitted from the charge trapping layer disposed between the electrode and the semiconductor substrate so that programming and erasing may be performed.

As described above, data may be programmed or erased by using charges in the unit cell of the floating gate and the charge trapping non-volatile memory devices; however, stored charges in the floating gate or the charge trapping layer may move from the floating gate or the charge trapping layer due to cell to cell interference between adjacent cells in the above non-volatile memory devices, and thus operation failures may occur.

Additionally, the number of the charges stored in the floating gate or the charge trapping layer is very small because the non-volatile memory device may be highly integrated. Accordingly, data stored in a cell of the non-volatile memory device may be difficult to distinguish from that in another cell, and data distribution in the cells may not be good.

SUMMARY OF THE INVENTION

In accordance with some embodiments of the present invention, there is provided a non-volatile memory device including a substrate having a recess thereon, a resistant material layer pattern in the recess, a lower electrode on the resistant material layer pattern in the recess, a dielectric layer, and an upper electrode formed on the dielectric layer. The resistant material layer pattern includes a material whose resistance varies according to an applied voltage. The dielectric layer is formed on the substrate, the resistant material layer pattern and the lower electrode. An upper electrode overlaps the resistant material layer pattern and the lower electrode. The applied voltage is applied to access the upper and lower electrodes to vary the resistance of the resistant material layer pattern.

In some embodiments of the present invention, the resistant material layer pattern is on a bottom and a sidewall of the recess.

In some embodiments of the present invention, the resistant material layer pattern may include a metal oxide. For example, the resistant material layer pattern may comprise zirconium oxide, tantalum oxide, niobium oxide, strontium zirconium oxide doped with chrome.

In some example embodiments of the present invention, the non-volatile memory device may further include an impurity region formed at an upper portion of the substrate adjacent to the upper electrode. At least a portion of the impurity region may contact the resistant material layer pattern.

In some example embodiments of the present invention, the non-volatile memory device may further include an isolation layer pattern extending in a first direction at an upper portion of the substrate. The isolation layer pattern divides the substrate into an isolation region and an active region.

In some embodiments, a plurality of recesses may be formed on the active region of the substrate. Each of the recesses can include the resistant material layer pattern and the lower electrode. The isolation layer pattern may be exposed at an inside wall of the recess. The resistant material layer pattern and the lower electrode may be included in a unit cell. A plurality of the unit cells is configured to be electrically connected to one another in series to form a string. The non-volatile memory device may further include a metal-oxide-semiconductor (MOS) transistor formed at both ends of the string, the MOS transistor being configured for selecting the string. The upper electrode may have a linear shape extending in a second direction substantially perpendicular to the first direction In accordance with further embodiments of the present invention, there is provided a method of manufacturing a non-volatile memory device. In the method of manufacturing a non-volatile memory device, a substrate having a recess thereon is provided. A resistant material layer and a lower electrode are formed in the recess. A dielectric layer is formed on the substrate, the resistant material layer pattern and the lower electrode. An upper electrode is formed on the dielectric layer. The upper electrode overlaps the resistant material layer pattern and the lower electrode.

In some embodiments of the present invention, to form the resistant material layer pattern and the lower electrode, a resistant material layer is formed on a bottom and a sidewall of the recess and the substrate. A first conductive layer is formed on the resistant material layer to fill up the recess. The first conductive layer and the resistant material layer are polished until the substrate is exposed.

In some embodiments, the resistant material layer pattern may include a metal oxide.

In some example embodiments of the present invention, the method may further include a process of forming an impurity region at an upper portion of the substrate adjacent to the upper electrode.

In accordance with further embodiments of the present invention, there is provided a method of manufacturing a non-volatile memory device. In the method of manufacturing a non-volatile memory device, an isolation layer pattern extending in a first direction on a substrate is formed to define an active region and an isolation region in the substrate. A plurality of recesses is formed by partially removing the active region of the substrate. A plurality of resistant material layer patterns and a plurality of lower electrodes are formed in the recesses. Each of the recesses include respective resistant material layer patterns and lower electrodes. A dielectric layer is formed on the substrate, the resistant material layer patterns and the lower electrodes. A plurality of upper electrodes is formed on the dielectric layer. The upper electrodes overlap the resistant material layer patterns and the lower electrodes.

In some embodiments of the present invention, the isolation layer pattern may be exposed at by a sidewall of the recess.

In some embodiments of the present invention, the recesses may be formed to be arranged to be spaced apart from each other by a regular interval.

In some embodiments of the present invention, each of the upper electrodes may have a linear shape extending in a second direction substantially perpendicular to the first direction.

In accordance with further embodiments of the present invention, there is provided a method of operating a non-volatile memory device. The non-volatile memory device includes a substrate having a plurality of cells. Each cell includes a recess on the substrate, a resistant material layer pattern including a material whose resistance varies according to an applied voltage in the recess, a lower electrode on the resistant material layer pattern and in the recess, a dielectric layer on the substrate, the resistant material layer pattern and the lower electrode, an upper electrode overlapping the resistant material layer pattern and the lower electrode on the dielectric layer. Data in a cell is programmed by applying a programming voltage to the upper electrode to reduce a resistance of the resistant material layer pattern. Data in a cell is erased by applying an erasing voltage between the upper electrode and the substrate to increase a resistance of the resistant material layer pattern. Data stored in the cell is read based on a current flowing through the resistant material layer pattern and the lower electrode at a portion of the substrate adjacent to the resistant material layer pattern.

In some embodiments of the present invention, a plurality of the cells may be disposed in a direction to form a string. The data in the cell may be collectively erased by applying an erasing voltage to the substrate and applying a voltage of 0V to the upper electrode.

In some embodiments of the present invention, the data stored in the cell may be read by determining whether the measured current exceeds a predetermined value. For example, the cell may be considered to be in a programmed state when the measured current exceeds the predetermined value, and may be considered to be in an erased state when the measured current is less than the predetermined value.

BRIEF DESCRIPTION OF THE DRAWINGS

The above and other features and advantages of the present invention will become more apparent by describing in detailed example embodiments thereof with reference to the accompanying drawings, in which.

DESCRIPTION OF EMBODIMENTS

Figure 1:
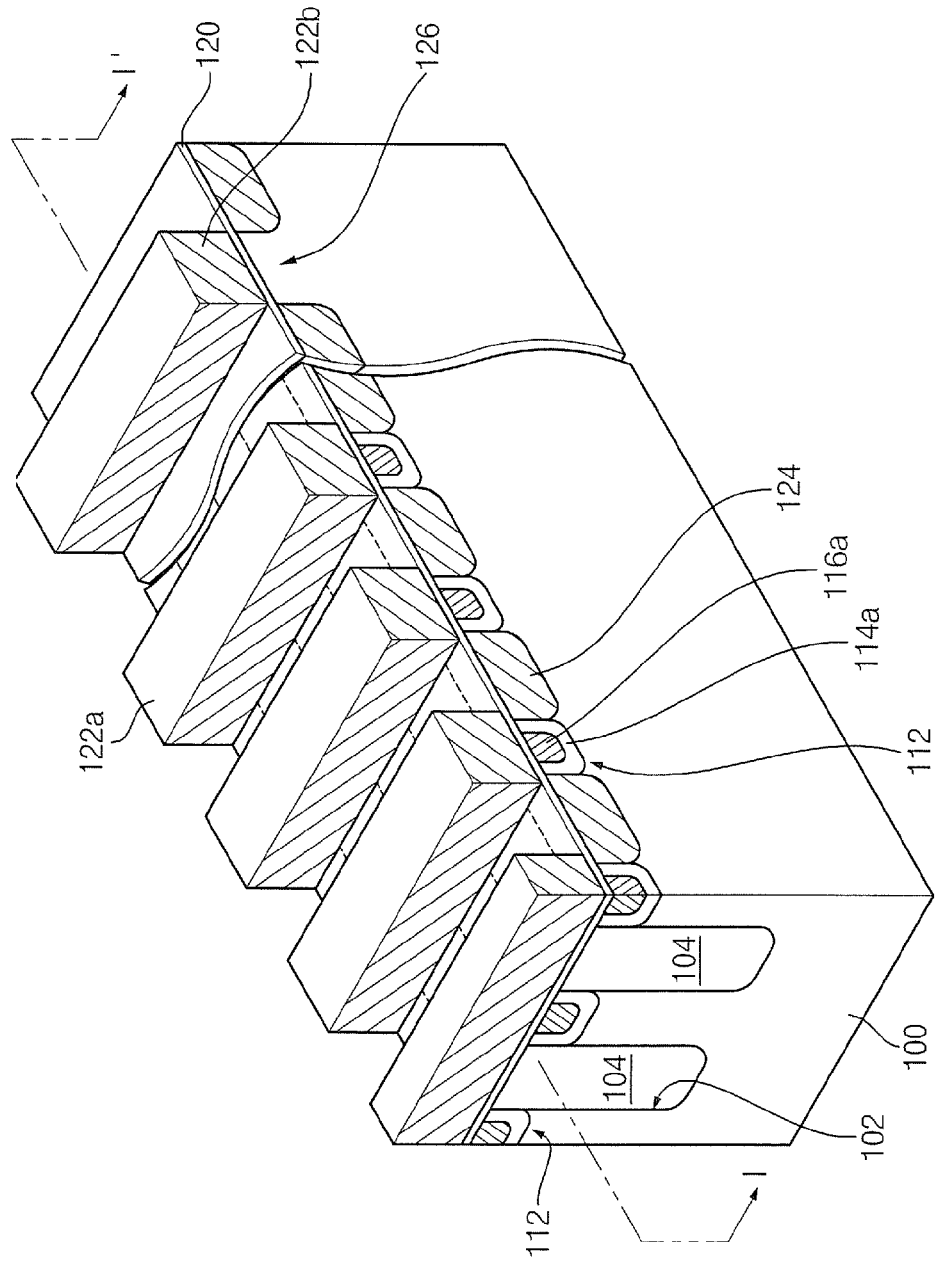
FIG. 1 is a perspective view illustrating a non-volatile memory device according to embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Non-Volatile Memory Device Including a Resistant Material

Figure 2:
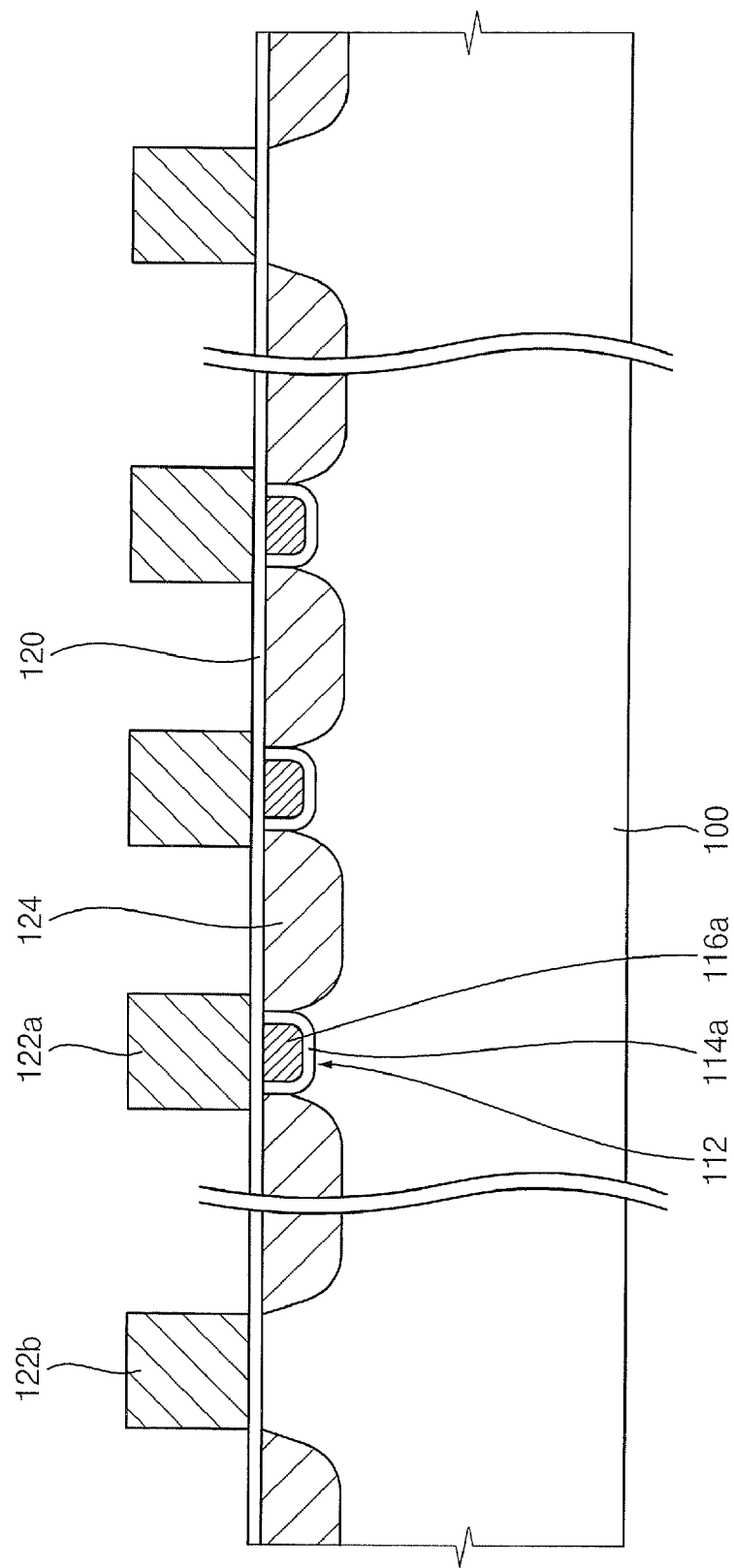
FIG. 2 is a cross-sectional view taken along a line I-I' in FIG. 1.

FIG. 1 is a perspective view illustrating a non-volatile memory device in accordance with some example embodiments of the present invention. FIG. 2 is a cross-sectional view taken along a line I-I' in FIG. 1. Although FIGS. 1 and 2 illustrate a NAND flash memory device, embodiments of the present invention may be employed in another type of non-volatile memory device, such as a NOR flash memory device.

Referring to FIGS. 1 and 2, the non-volatile memory device includes a substrate 100. The substrate 100 may include single crystal silicon.

A trench 102 filled with an isolation layer pattern 104 is formed on the substrate 100, and thus the substrate 100 may be divided into an active region and the isolation region on which the trench 102 is formed. The isolation layer pattern 104 may have a linear shape extending in a first direction.

A plurality of recesses 112 is formed on the active region of the substrate 100. The recesses 112 may be spaced apart from each other by a predetermined interval in the active region. In some embodiments, each of the recesses 112 is spaced apart from one another by the same interval. As illustrated in FIGS. 1 and 2, the isolation layer pattern 104 partially contacts the recesses 112.

Each of the recesses 112 may have a bottom higher than that of the isolation layer pattern 104 so that the active region may be divided into a plurality of sub-regions that are electrically isolated from each other.

A resistant material layer pattern 114a is formed on the bottom and on the sidewall of each of the recesses 112. The resistant material layer pattern 114a includes a material whose resistance varies according to an applied voltage. The resistant material layer pattern 114a may include a metal oxide such as zirconium oxide (ZrOx), tantalum oxide (TaOx), niobium oxide (NbOx), strontium zirconium oxide doped with chrome (Cr-doped StZrOx), etc. These materials may be used alone or in a mixture thereof.

The resistant material layer pattern 114a may have a stacked structure in which a first metal oxide and a second metal oxide are sequentially stacked. The first metal oxide may include a metal oxide having an oxygen content that is lower than that of a stoichiometrically stable metal oxide and the second metal oxide may include a stoichiometrically stable metal oxide.

The resistant material layer pattern 114a may have a resistance varying according to a voltage applied to both ends of the resistant material layer pattern 114a. For example, the resistant material layer pattern 114a may have a relatively high resistance when a voltage of more than a predetermined value is applied thereto and a relatively low resistance when a voltage of less than a predetermined value is applied thereto.

A lower electrode 116a is formed on the resistant material layer pattern 114a. The lower electrode 116a may fill the remaining portion of each of the recesses 112. The lower electrode 116a may include a conductive material. For example, the lower electrode 116a may include polysilicon doped with impurities, a metal, nanocrystalline silicon, etc.

Instead of the injection or the emission of the charges, data may be written in the non-volatile memory device in accordance with some embodiments of the present invention by applying voltages to the lower electrode 116a as well as the substrate 100 to change the resistance of the resistant material layer pattern 114a formed between the lower electrode 116a and the substrate 100. In some embodiments of the invention, a data is generally not written in a cell by injecting charges into the lower electrode 116a or emitting charges from the lower electrode 116a in the non-volatile memory device in accordance with some embodiments of the present invention. This is different from the techniques of writing data in a cell of the conventional flash memory device in which data may be written in the cell by injecting charges into or emitting charges from a floating gate (or a charge trapping layer).

When the resistance of the resistant material layer pattern 114a is reduced, current may flow between the lower electrode pattern 116a and the substrate 100 through the resistant material layer pattern 114a surrounding the lower electrode 116a. When the resistance of the resistant material layer pattern 114a increases, current may not flow between the lower electrode pattern 116a and the substrate 100 because of the resistant material layer pattern 114a surrounding the lower electrode 116a.

A dielectric layer 120 is formed on the resistant material layer pattern 114a and the lower electrode 116a. Upper surfaces of the resistant material layer pattern 114a and the lower electrode 116a may be on substantially the same level with an upper surface of the substrate 100 so that the dielectric layer 120 may be formed on the lower electrode pattern 116a with a substantially uniform thickness.

In some embodiments of the present invention, the dielectric layer 120 has a structure in which a silicon oxide layer, a silicon nitride layer and a silicon oxide layer are sequentially stacked. Alternatively, the dielectric layer 120 may include a metal oxide or a metal oxynitride having a high dielectric constant. For example, the metal oxide may include tantalum oxide ($Ta_2O_5$), titanium oxide ($TiO_2$), hafnium silicate ($HfSi_xO_y$), zirconium silicate ($ZrSi_xO_y$), hafnium silicon oxynitride ($HfSi_xO_yN_z$), zirconium silicon oxynitride ($ZrSi_xO_yN_z$), aluminum oxide ($Al_2O_3$), aluminum oxynitride ($Al_xO_yN_z$), hafnium aluminate ($HfAl_xO_y$), yttrium oxide ($Y_2O_3$), niobium oxide ($Nb_2O_5$), cerium oxide ($Ce_2O_5$), indium oxide ($InO_3$), lanthanum oxide ($LaO_2$), strontium titanium oxide ($SrTiO_3$), lead titanium oxide ($PbTiO_3$), strontium ruthenium oxide (SrRuO3), calcium ruthenium oxide (CaRuO3), etc. These may be used alone or in a mixture thereof.

An upper electrode 122a is formed on the dielectric layer 120. The upper electrode 122a may include polysilicon doped with impurities, a metal, etc. The upper electrode 122a overlaps the resistant material layer pattern 114a and the lower electrode 116a. As noted above, the isolation layer pattern 104 may have a linear shape extending in a first direction. The upper electrode 122a may have a linear shape extending in a second direction that is substantially perpendicular to the first direction. The upper electrode 122a may serve as a word line that controls a plurality of the lower electrodes 116a formed in the second direction.

When a first voltage is applied to the upper electrode 122a, a second voltage may be applied to the lower electrode 116a, so that an electric potential difference may be generated. Accordingly, the resistance of the resistant material layer pattern 114a may be changed.

An impurity region 124 is formed at an upper portion of the substrate 100 adjacent a sidewall of the upper electrode 122a. The impurity region 124 may be doped with n-type impurities. The impurity region 124 may make contact with the recess 112.

In the some embodiments, the impurity region 124 is formed adjacent the upper electrode 122a; however, the impurity region 124 may be omitted, and the non-volatile memory device in accordance with some embodiments of the present invention may be operated even without the impurity region 124.

As illustrated in FIGS. 1 and 2, the resistant material layer pattern 114a and the lower electrode 116a are formed in each of the recesses 112, and the upper electrode 122a is formed over the resistant material layer patterns 114a and the lower electrodes 116a. The resistant material layer pattern 114a, the lower electrode 116a and the upper electrode 122a form a unit cell, and a plurality of the unit cell disposed in the first direction may be referred to as a string. One string may include any suitable number of unit cells, such as 16 or 32 unit cells.

A metal-oxide-semiconductor (MOS) transistor 126 may be formed at both ends of the string to select the string. The MOS transistor 126 (which, as illustrated, does not include a recess, a resistant material layer pattern or a lower electrode) includes a gate having the dielectric layer 120 and an electrode 122b. Additionally, the impurity region 124 adjacent to a sidewall of the gate may serve as a source/drain region.

Method of Operating a Non-Volatile Memory Device

Figure 3:
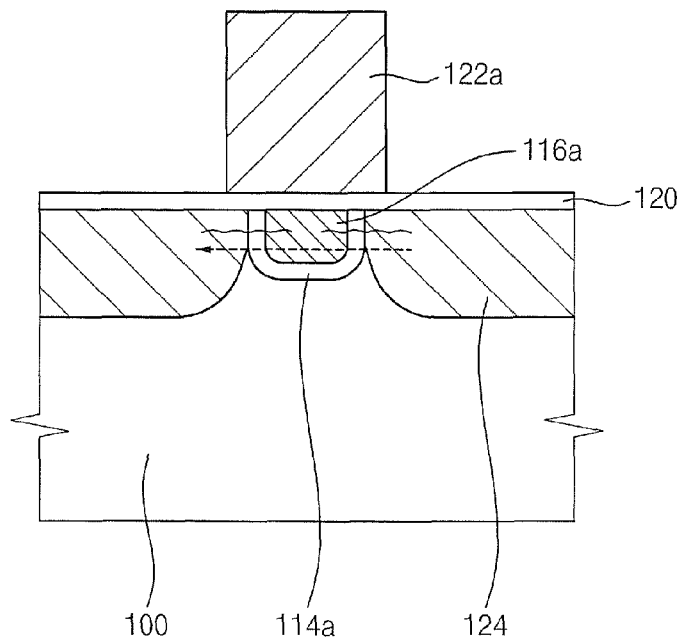
FIGS. 3 and 4 are cross-sectional views illustrating a method of operating a non-volatile memory device according to embodiments of the present invention.
Figure 4:
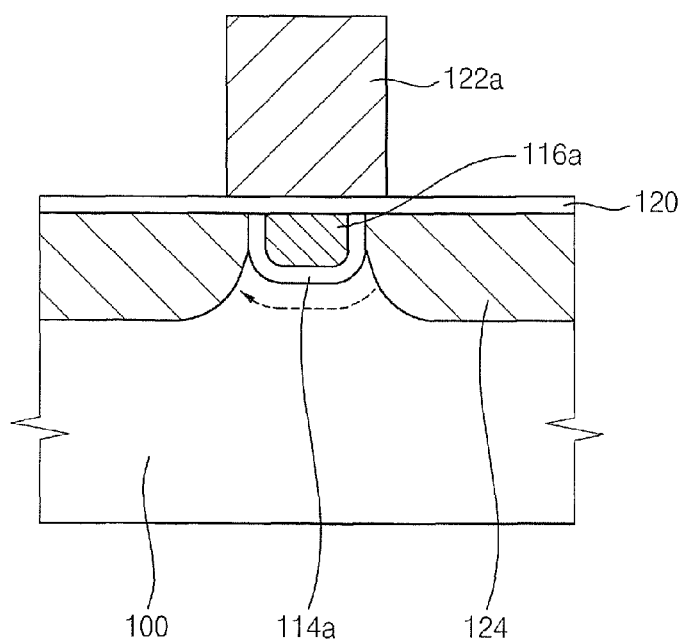

FIGS. 3 and 4 are cross-sectional views illustrating a method of operating a non-volatile memory device in accordance with some embodiments of the present invention.

A method of programming data in a cell will be illustrated with reference to FIG. 3.

Referring to FIG. 3, a programming voltage (Vpgm) is applied between a substrate 100 and an upper electrode 122a to program data in a selected cell. For example, the programming voltage may be applied to the upper electrode 122a and the substrate 100 may be kept at a voltage of about 0V, and the programming voltage can be a voltage at which a resistant material layer pattern 114a may be converted into a low resistance state. For example, the programming voltage may be in a range of about 5V to about 6V.

When the programming voltage is applied to the upper electrode 122a, a voltage may be applied to a lower electrode 116a by a coupling between the upper electrode 122a and the lower electrode 116a, and thus a resistance of the resistant material layer pattern 114a may be reduced. Accordingly, a current may flow through the resistant material layer pattern 114a and the lower electrode 116a, and a current path may be generated between portions of an active region making contact with the resistant material layer pattern 114a, that is, impurity regions 124.

The impurity regions 124 are electrically connected to each other through the resistant material layer pattern 114a in the low resistance state and the lower electrode 116a; thus, a high current may flow through the resistant material layer pattern 114a and the lower electrode 116a.

As illustrated above, data may be programmed in the cell by converting the resistant material layer pattern 114a into the low resistance state.

Hereinafter, a method of operating a NAND flash memory device in accordance with some embodiments of the present invention will be illustrated with reference to FIG. 5.

Figure 5:
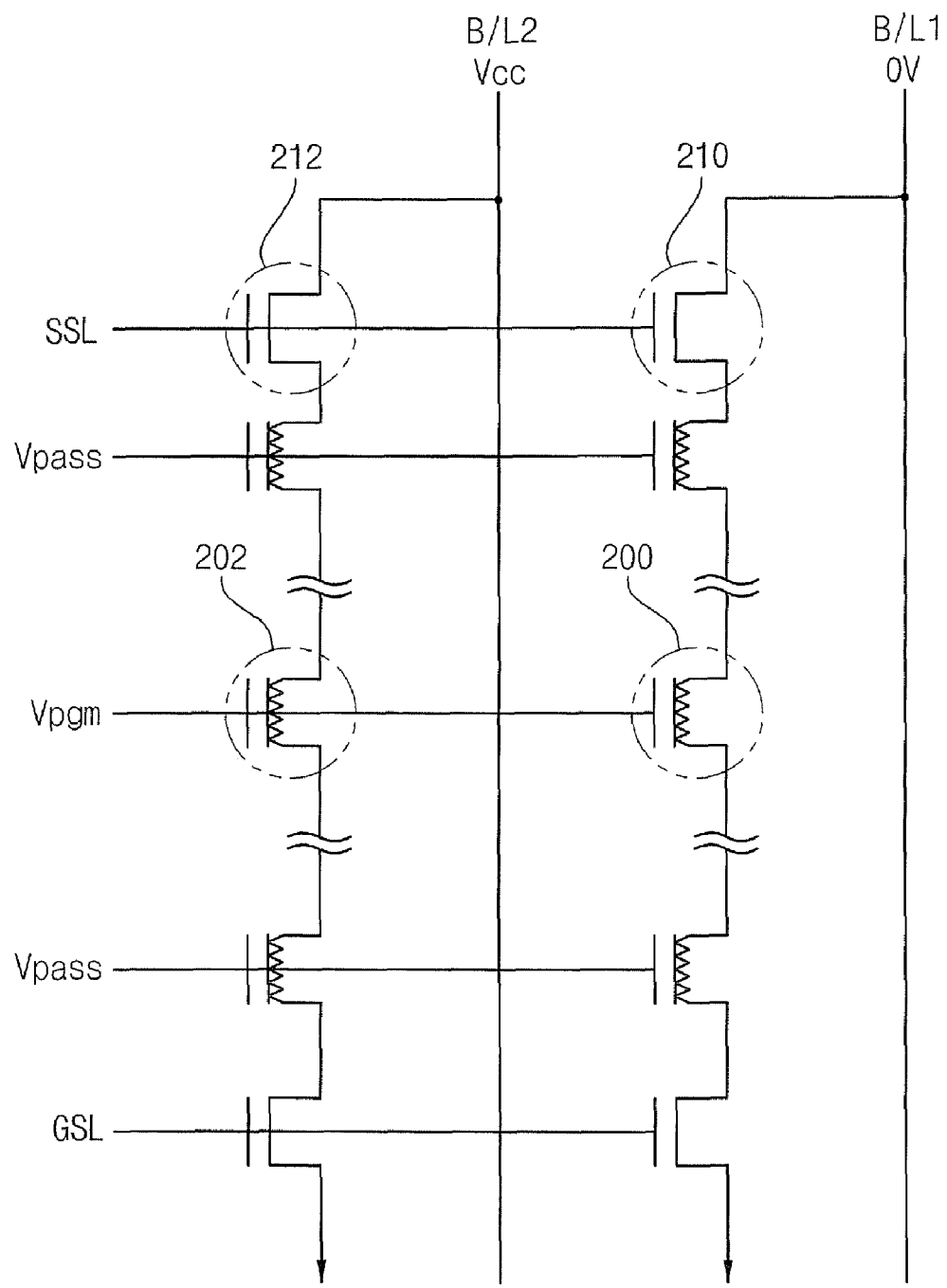
FIG. 5 is an equivalent circuit diagram illustrating a cell string of the non-volatile memory device illustrated in FIG. 1.

FIG. 5 is an equivalent circuit diagram of a cell string of the non-volatile memory device in FIG. 1.

Referring to FIG. 5, a NAND flash memory device has a string structure in which a plurality of cells is electrically connected to one another in series, and adjacent strings have an upper electrode (that is, a word line) in common. Therefore, a programming inhibition voltage (Vinhibit) is applied to unselected cells when data is programmed in a selected cell, so that data may not be programmed in the unselected cells.

For example, a programming voltage (Vpgm) is applied to an upper electrode corresponding to a selected cell 200 and a portion of a substrate under the selected cell 200 is maintained at a voltage of about 0V so that data may be programmed in the selected cell 200. In order that the portion of the substrate under the selected cell 200 may be maintained at the voltage of about 0V, a voltage of about 0V is applied to a first impurity region B/L 1 of a first selected transistor 210 that is electrically connected to the selected cell 200, and a pass voltage (Vpass) at which a channel may be formed at a portion of the substrate under a recess is applied to upper electrodes of the adjacent cells that is electrically connected to the first selected transistor 210 in series.

The selected upper electrode of the selected cell 200 controls corresponding lower electrodes and resistant material layer patterns, e.g., corresponding to the upper electrode 122a, resistant material layer pattern 114a and lower electrode 116a shown in FIGS. 1-4. As shown in FIGS. 1-4, the isolation layer pattern 104 extends in the first direction, and the upper the upper electrode 112a, resistant material layer patter 114a and lower electrode extend in a second direction. Accordingly, when a programming voltage is applied to the upper electrode (e.g., upper electrode 112a in FIGS. 1-4) of the selected cell 200, unselected cells 202 adjacent to the selected cell 200 in the second direction may be also programmed. Therefore, a programming inhibition voltage is applied to the unselected cells 202 so that the unselected cells 202 may not be programmed.

For example, a power supply voltage (Vcc) is applied to a second impurity region B/L2 of a second select transistor 212 that is electrically connected to the unselected cells 202, and a pass voltage (Vpass) at which a channel may be formed at a portion of the substrate under a recess is applied to the upper electrode of the adjacent cells that are electrically connected to the second select transistor 212 in series. In this case, a portion of the substrate under the unselected cell 202 has a voltage lower than the power supply voltage (Vcc). An electric potential difference between both ends of the resistant material layer pattern is scarcely generated even though the programming voltage (Vpgm) is applied to the upper electrode because the programming voltage has been applied to the portion of the substrate under the unselected cell 202.

Methods of programming data in a NAND flash memory device in accordance with some embodiments of the present invention that are similar to that of the conventional NAND flash memory device, and thus are omitted here.

Hereinafter, a method of erasing data in a cell in accordance with some example embodiments of the present invention will be illustrated with reference to FIG. 4.

Referring to FIG. 4, an erasing voltage (Verase) is applied between a substrate 100 and an upper electrode 122*a* to erase data in a cell. In this case, the resistance of the resistant material layer pattern 114*a* increases.

When data is collectively erased in all cells of the non-volatile memory device, a voltage of about 0V is applied to the upper electrode 122*a* and an erasing voltage is applied to the substrate 100. For example, the erasing voltage may be in a range of about 2V to about 3V.

When data is erased by the block including a plurality of cell strings, a voltage of about 0V is applied to the upper electrode 122*a* of a block that is to be erased, and an erasing voltage is applied to the substrate 100. Additionally, a voltage substantially the same as the erasing voltage is applied to a block that is not to be erased, so that an electric potential difference may not be generated and thus data may not be erased.

When a resistance of the resistant material layer pattern 114*a* increases through the erasing operation, a current may not flow through the resistant material layer pattern 114*a* and the lower electrode 116*a*. Accordingly, the current path having been generated (see FIG. 3) between the portions of the active region making contact with the resistant material layer pattern 114*a*, that is, the impurity regions 124 may vanish.

In some embodiments of the present invention, data is not stored in a cell by the way of injecting charges into or emitting charges from a floating gate (or a charge trapping pattern). Instead, data may be stored in a cell by changing resistance of the resistant material layer pattern 114*a*. Therefore, according to the present invention, data may be programmed or erased with a voltage lower than that of the conventional non-volatile memory device. In some embodiments of the present invention, a programming operation or an erasing operation may be performed at a voltage below about 10V.

Accordingly, the non-volatile memory device in accordance with some example embodiments of the present invention does not require a high voltage transistor for applying a high voltage at a peri/core region in the conventional non-volatile memory device so that an integration degree of the memory device may be improved. Moreover, a process of forming the non-volatile memory device may be more simplified because additional processes for forming the high voltage transistor are not necessary.

A method of reading data in a cell will be illustrated with reference to FIGS. 3 and 4.

Referring to FIGS. 3 and 4, data may be read out by determining whether or not a current flowing through portions of the substrate 100 adjacent to both sides of the resistant material layer pattern 114*a*, that is, the impurity regions exceeds a predetermined value. When data is being read, the upper electrode 122*a* is advantageously maintained to have a constant voltage.

When data is read in a programmed cell, a high current flows through the impurity regions, because a current may flow through the resistant material layer pattern 114*a* and the lower electrode 116*a*.

However, when data is read in an erased cell, a high current does not flow through the impurity regions, because a current does not flow directly through the resistant material layer pattern 114*a* and the lower electrode 116*a*. In this case, a relatively low current may flow through a channel only when the channel is formed under the resistant material layer pattern 114*a* by a voltage applied to the upper electrode 122*a*.

Accordingly, when the predetermined value has been chosen between the current flowing through the impurity regions in the programmed cell and that in the erased cell, data stored in a selected cell may be read by determining whether or not the current measured in the selected cell exceeds the predetermined value. For example, the selected cell may be considered as a programmed cell when a current measured in the selected cell exceeds the predetermined value, and the selected cell may be considered as an erased cell when a current measured in the selected cell is less than the predetermined value.

In some example embodiments of the present invention, determining whether data is stored or not in a cell may be performed not by using charges stored in a floating gate or a charge trapping pattern, but by using variable resistance of the resistant material layer pattern in the cell. Therefore, operation failures caused by interference between the cells may be reduced, and a cell distribution may be improved.

Method of Manufacturing a Non-Volatile Memory Device

FIGS. 6 to 12 are cross-sectional views illustrating a method of manufacturing a non-volatile memory device in accordance with example embodiments of the present invention.

Figure 6:
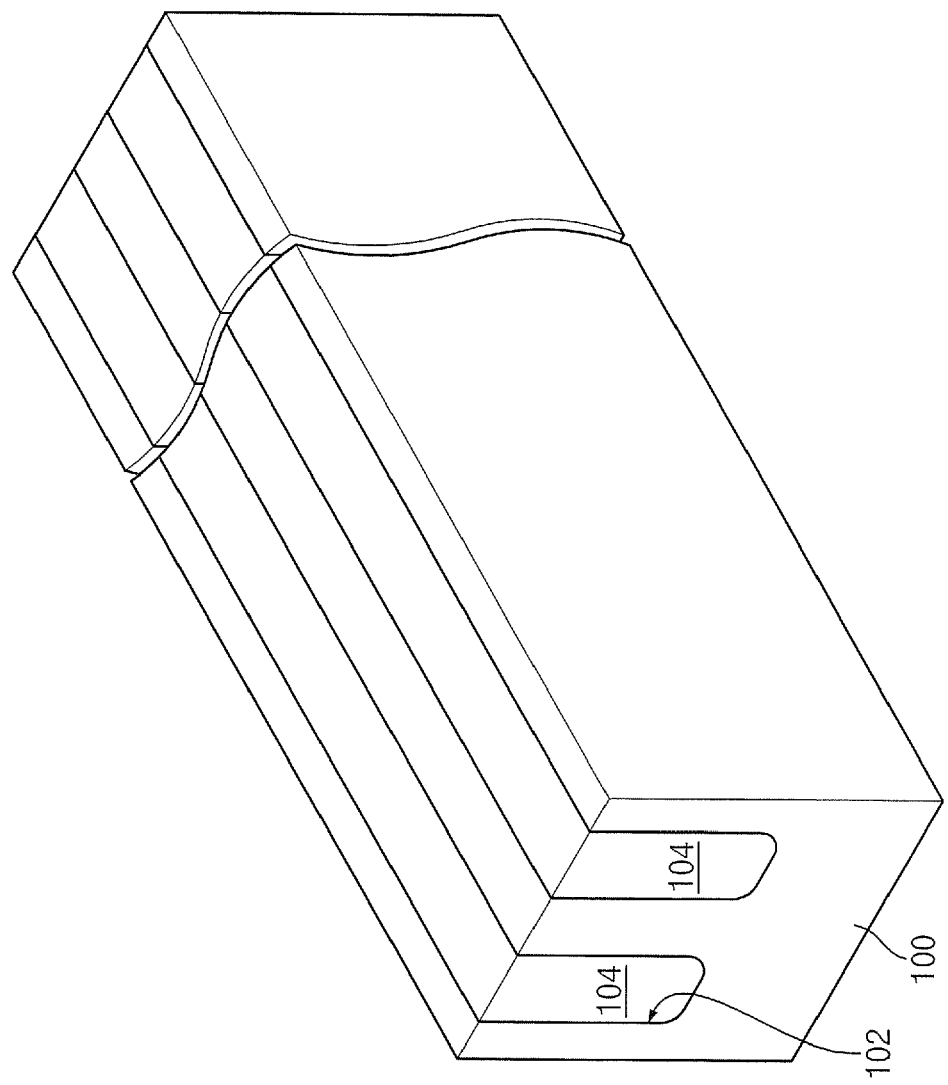
FIGS. 6 to 12 are cross-sectional views illustrating a method of manufacturing a non-volatile memory device according to embodiments of the present invention.

Referring to FIG. 6, an isolation layer pattern 104 is formed on a substrate 100 including a semiconductor material such as single crystalline silicon, etc. In embodiments of the present invention, the isolation layer pattern 104 may be formed by an isolation process such as a shallow trench isolation (STI) process. The isolation layer pattern 104 may be formed to have a linear shape extending in a first direction. That is, an active region and an isolation region, which are defined by the isolation layer pattern 104, may have a linear shape extending in the first direction.

In some embodiments of the present invention, a first pad oxide layer (not shown) and a first silicon nitride layer (not shown) are formed on the substrate 100. The first silicon nitride layer and the first pad oxide layer are partially etched to form a first hard mask (not shown) including a first pad oxide layer pattern and a first silicon nitride layer pattern sequentially stacked on the substrate 100 and exposing a portion of the substrate 100 corresponding to the isolation region.

The exposed portion of the substrate 100 is partially removed by an etching process using the first hard mask as an etching mask, thereby forming a trench 102. An oxide layer (not shown) may be formed on a bottom and a sidewall of the trench 102 so that damages to the bottom and the sidewall of the trench 102 generated when the trenches 102 is formed may be cured. The oxide layer may be formed by oxidizing a portion of the substrate 100 exposed by the bottom and the sidewall of the trench 102.

An insulation layer is formed on substrate 100 and the first hard mask to fill up the trenches 102. The insulation layer may be formed by a chemical vapor deposition (CVD) process, plasma enhanced chemical vapor deposition (PECVD) process, high density plasma-chemical vapor deposition (HDP-CVD) process, etc. The insulation layer may be formed using an oxide such as silicon oxide. For example, the insulation layer may include boro-phosphor silicate glass (BPSG), phosphor silicate glass (PSG), spin on glass (SOG), undoped silicate glass (USG), flowable oxide (FOX), tetraethylorthosilicate (TEOS), plasma enhanced-tetraethylorthosilicate (PE-TEOS), HDP-CVD oxide, etc. These may be used alone or in a mixture thereof. The insulation layer is polished until the first hard mask is exposed to form the isolation layer pattern 104 filling up the trench 102. When the first hard mask is removed, the substrate 100 may be divided into the active region and the isolation region.

In some embodiments of the present invention, a preliminary impurity region may be defined by implanting n-type impurities into an upper portion of the substrate 100 after forming the first pad oxide layer. In this case, a process for forming an impurity region 124 (see FIG. 12) at an upper portion of the substrate 100 adjacent to a resistant material layer pattern 114a (see FIG. 12) may be omitted. However, the process for forming the preliminary impurity region may be further performed later, or may not be performed for the simplicity.

Figure 7:
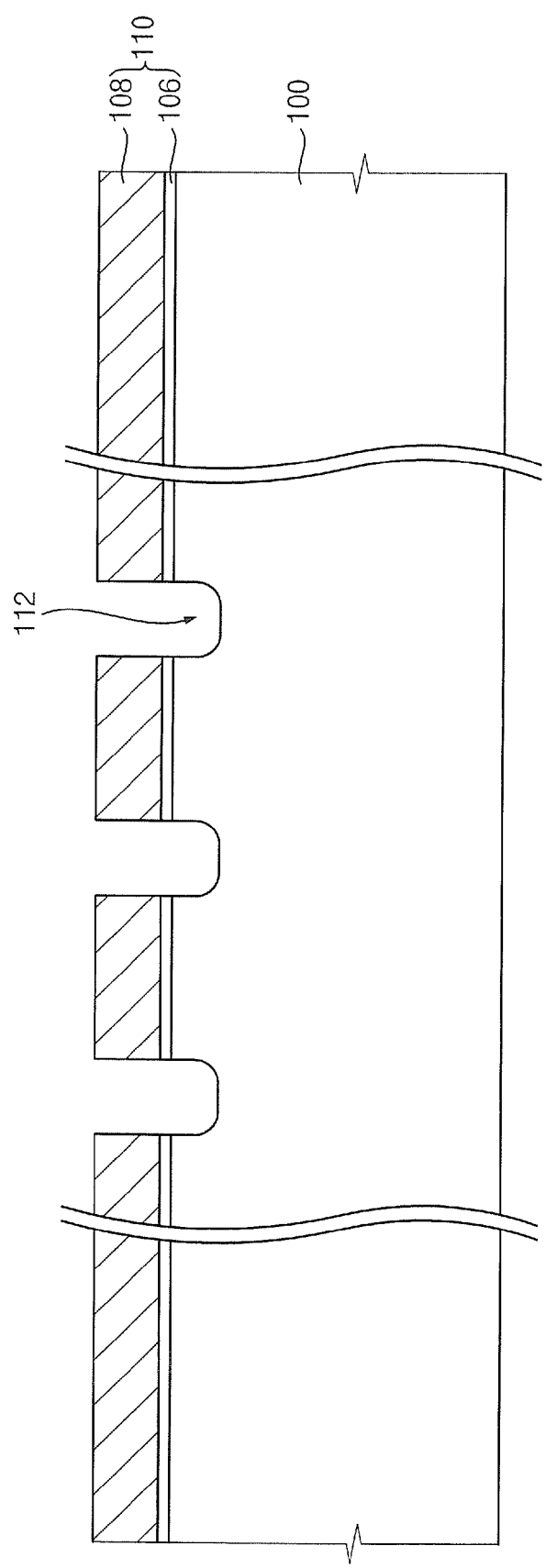

Referring to FIG. 7, a second pad oxide layer and a second silicon nitride layer are formed on the substrate 100 on which the isolation layer pattern 104 is formed.

The second silicon nitride layer and the second pad oxide layer are partially etched to form a second hard mask 110 including a second pad oxide layer pattern 106 and a second silicon nitride layer pattern 108 sequentially stacked on the substrate 100 and exposing a portion of the active region of the substrate 100. The portion of the active region is partially removed by an etching process using the second hard mask 110 as an etching mask to form a recess 112 at an upper portion of the substrate 100. When the second hard mask 110 is formed, the isolation layer pattern 104 (FIG. 6) is scarcely removed.

In a successive process, the resistant material layer pattern 114a and a lower electrode 116a (see FIG. 10) of a unit cell will be formed in the recess 112. In some embodiments of the present invention, a plurality of the recesses 112 are disposed to be spaced apart from each other by a predetermined distance. In some embodiments, the predetermined distance between each of the plurality of recesses 112 can be the same. Further, the recess 112 can be formed to partially expose a sidewall of the isolation layer pattern 104 (see FIG. 6).

In some embodiments of the present invention, the isolation layer pattern 104 may have a linear shape extending in a first direction, and the second hard mask 110 is formed to a linear shape extending in a second direction substantially perpendicular to the first direction.

In some embodiments of the present invention, a preliminary impurity region may be defined by implanting n-type impurities into an upper portion of the substrate 100 after forming the second pad oxide layer. In this case, a process for forming the impurity region 124 (see FIG. 12) at the upper portion of the substrate 100 adjacent to the resistant material layer pattern 114a (see FIG. 12) may be omitted. However, the process for forming the preliminary impurity region may be further performed later, or may not be performed for simplicity.

When the preliminary impurity region is formed before forming the recess 112, the recess 112 is formed to have a bottom that is lower (i.e., deeper) than that of the preliminary impurity region. Thus, the preliminary impurity region may be divided into sub-regions isolated form each other by the recess 112, and all regions including the sub-regions may be referred to as an impurity region.

Figure 8:
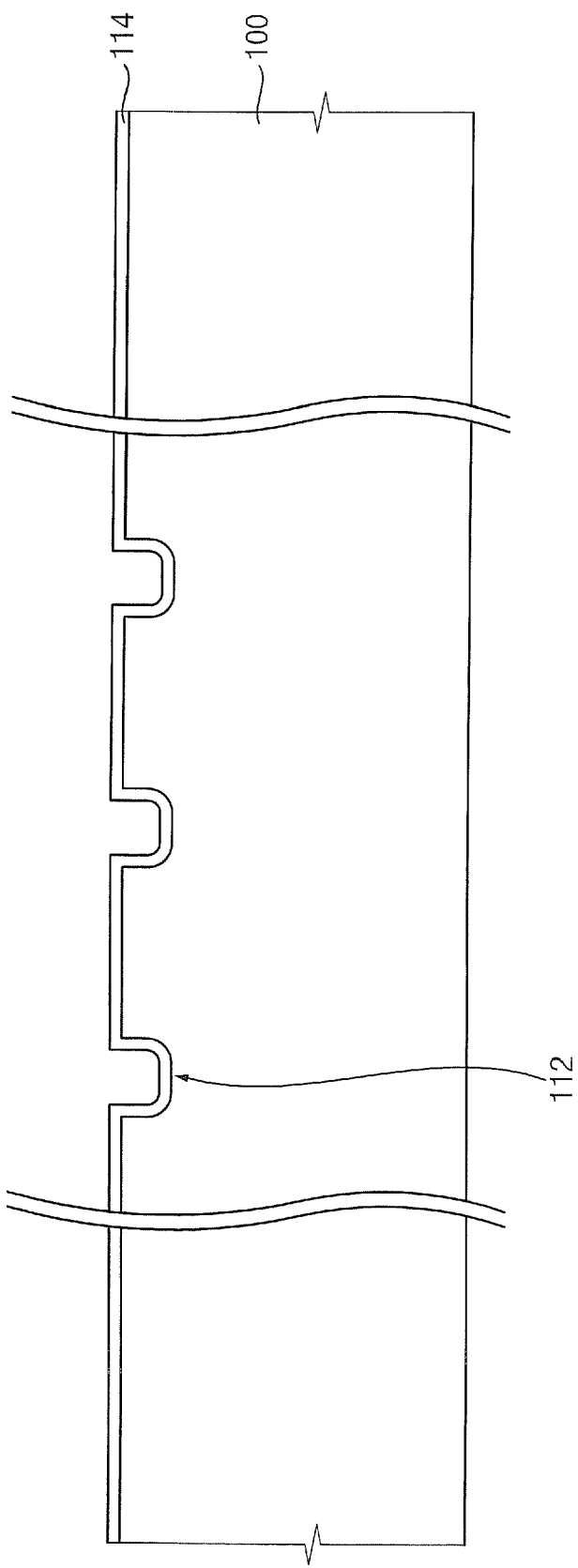

Referring to FIG. 8, the second hard mask 110 is removed to expose an upper face of the substrate 100. In some embodiments of the present invention, the second hard mask 110 may be removed by a wet etching process so that damages to the upper face of the substrate 100 may be reduced. Then, a resistant material layer 114 is formed on the bottom and a sidewall of the recess 112 and the upper face of the substrate 100. The resistant material layer 114 is formed such that it does not completely fill up the recess 112. The resistant material layer 114 is advantageously formed to have a uniform thickness on the bottom and the sidewall of the recess 112.

The resistant material layer 114 is formed using a material whose resistance varies according to an applied voltage. For example, the resistant material layer 114 may be formed using a metal oxide such as zirconium oxide (ZrOx), tantalum oxide (TaOx), niobium oxide (NbOx), strontium zirconium oxide doped with chrome (Cr-doped StZrOx), etc.

The resistant material layer 114 is advantageously formed to have a uniform thickness on the bottom and the sidewall of the recess 112 and the upper face of the substrate 100. Thus, the resistant material layer 114 may be formed by a metal organic chemical vapor deposition (MOCVD) process or an atomic layer deposition (ALD) process having good step coverage characteristics. Alternatively, the resistant material layer 114 may be also formed by a physical vapor deposition (PVD) process.

Figure 9:
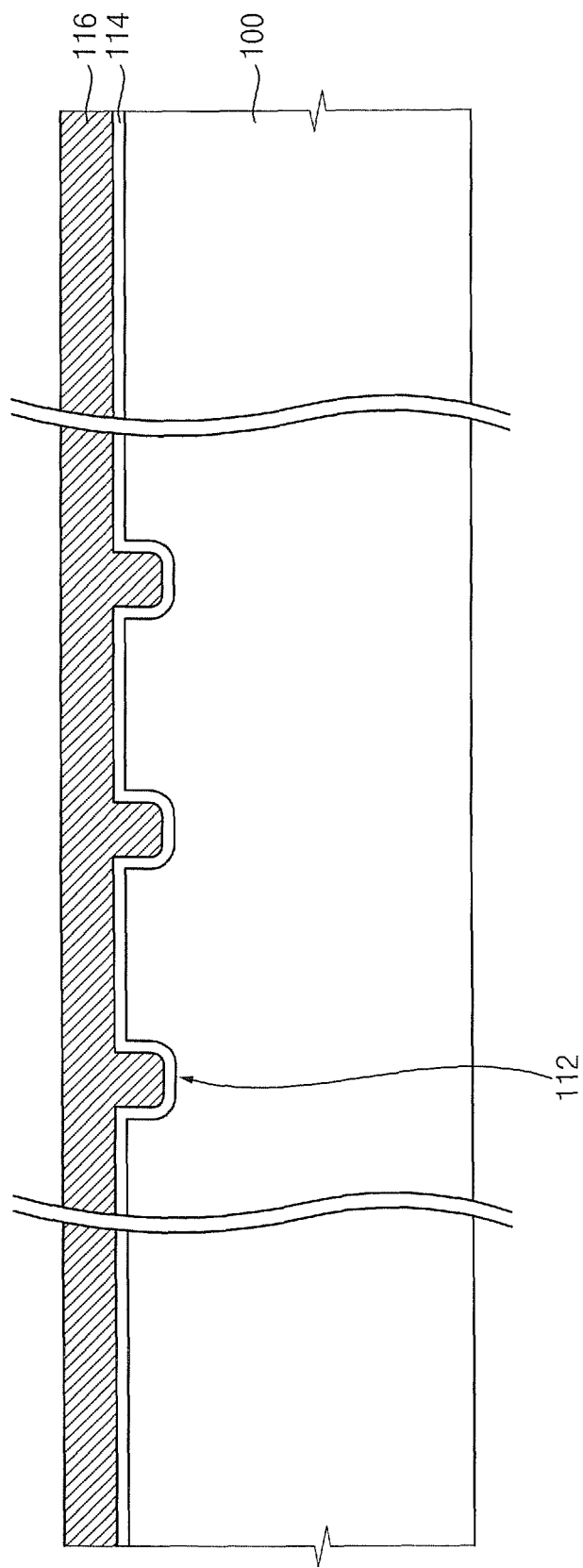

Referring to FIG. 9, a first conductive layer 116 is formed on the resistant material layer 114 to fill up the recess 112. The first conductive layer 116 may be formed using polysilicon doped with impurities, a metal, nanocrystalline silicon, etc. Alternatively, the first conductive layer 116 may be formed using polysilicon having good step coverage characteristics.

Figure 10:
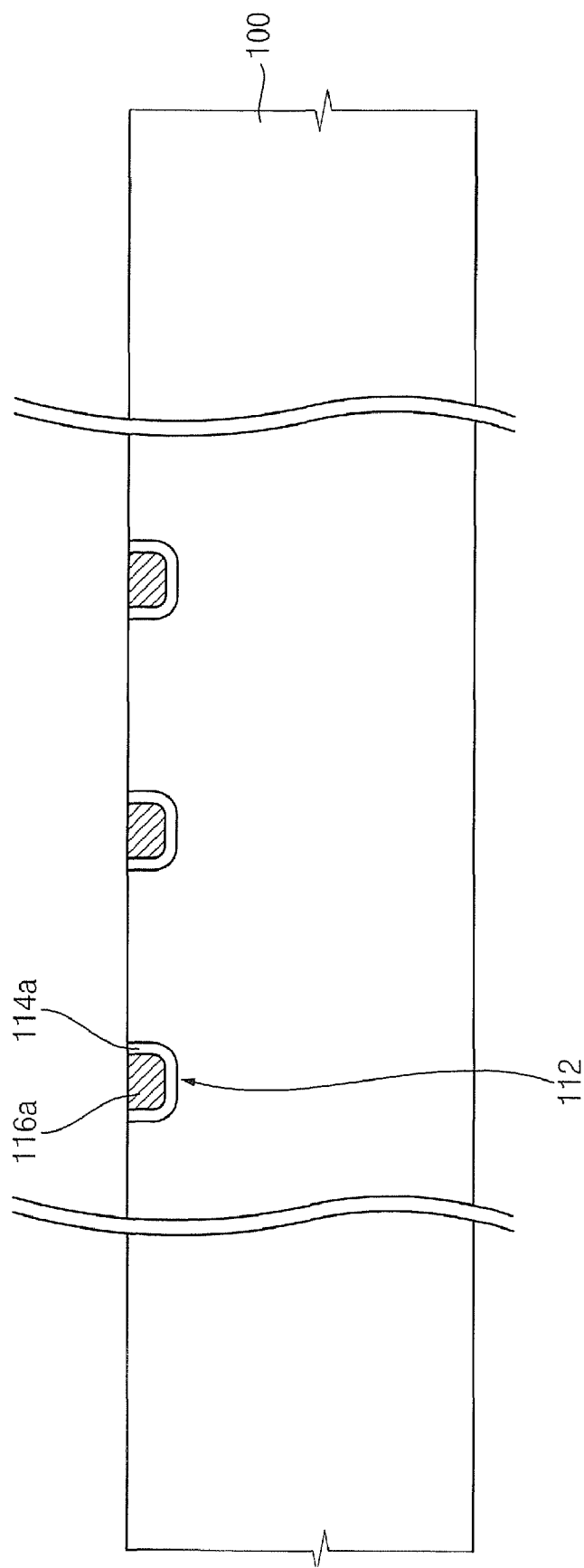

Referring to FIG. 10, upper portions of the first conductive layer 116 and the resistant material layer 114 are polished until the upper face of the substrate 100 is exposed to form the resistant material layer pattern 114a and the lower electrode 116a. The resistant material layer pattern 114a may be formed to enclose a bottom and a sidewall of the lower electrode 116a. Upper faces of the lower electrode 116a and the resistant material layer pattern 114a may be formed to be on substantially the same level as that of the substrate 100.

Figure 11:
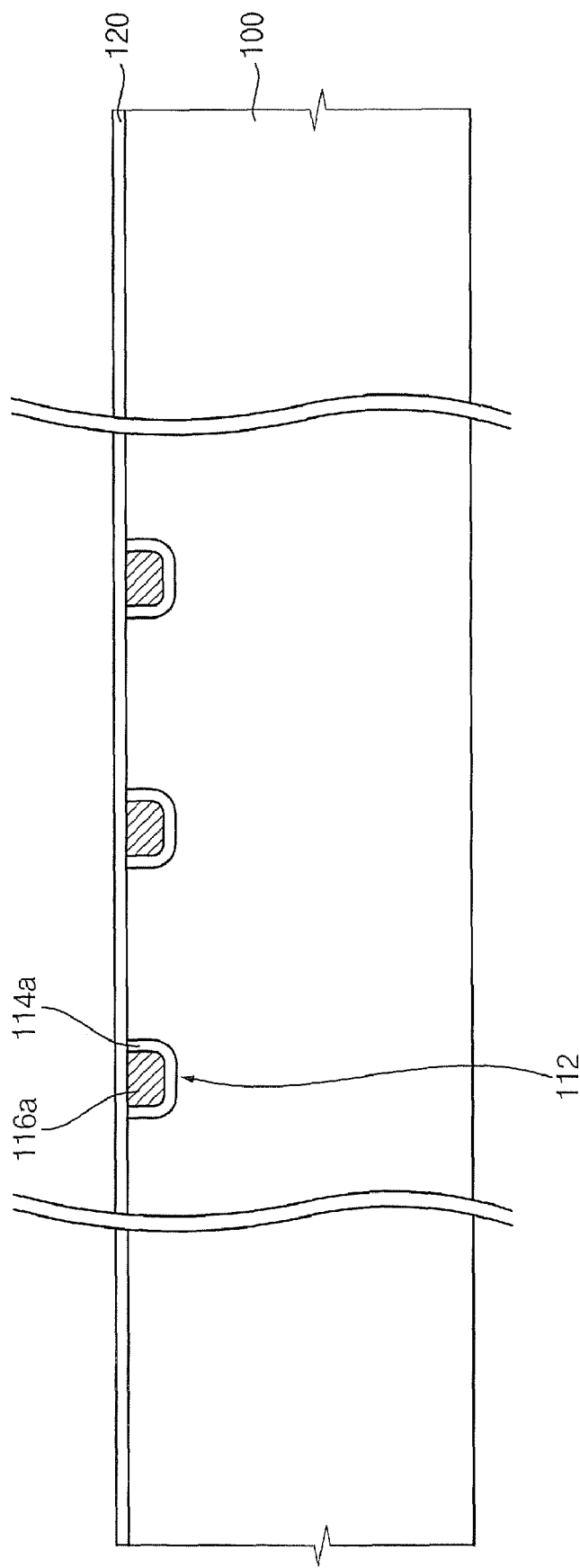

Referring to FIG. 11, a dielectric layer 120 is formed on the substrate 100, the lower electrode 116a and the resistant material layer pattern 114a. In some embodiments of the present invention, the dielectric layer 120 may be formed by sequentially forming a silicon oxide layer (not shown), a silicon nitride layer (not shown) and a silicon oxide layer (not shown). The silicon oxide layers and the silicon nitride layer may be formed by a CVD process. Alternatively, the dielectric layer 120 may be formed using a metal oxide having a dielectric constant higher than that of a silicon oxide. The metal oxide may be formed by a CVD process or an ALD process.

Figure 12:
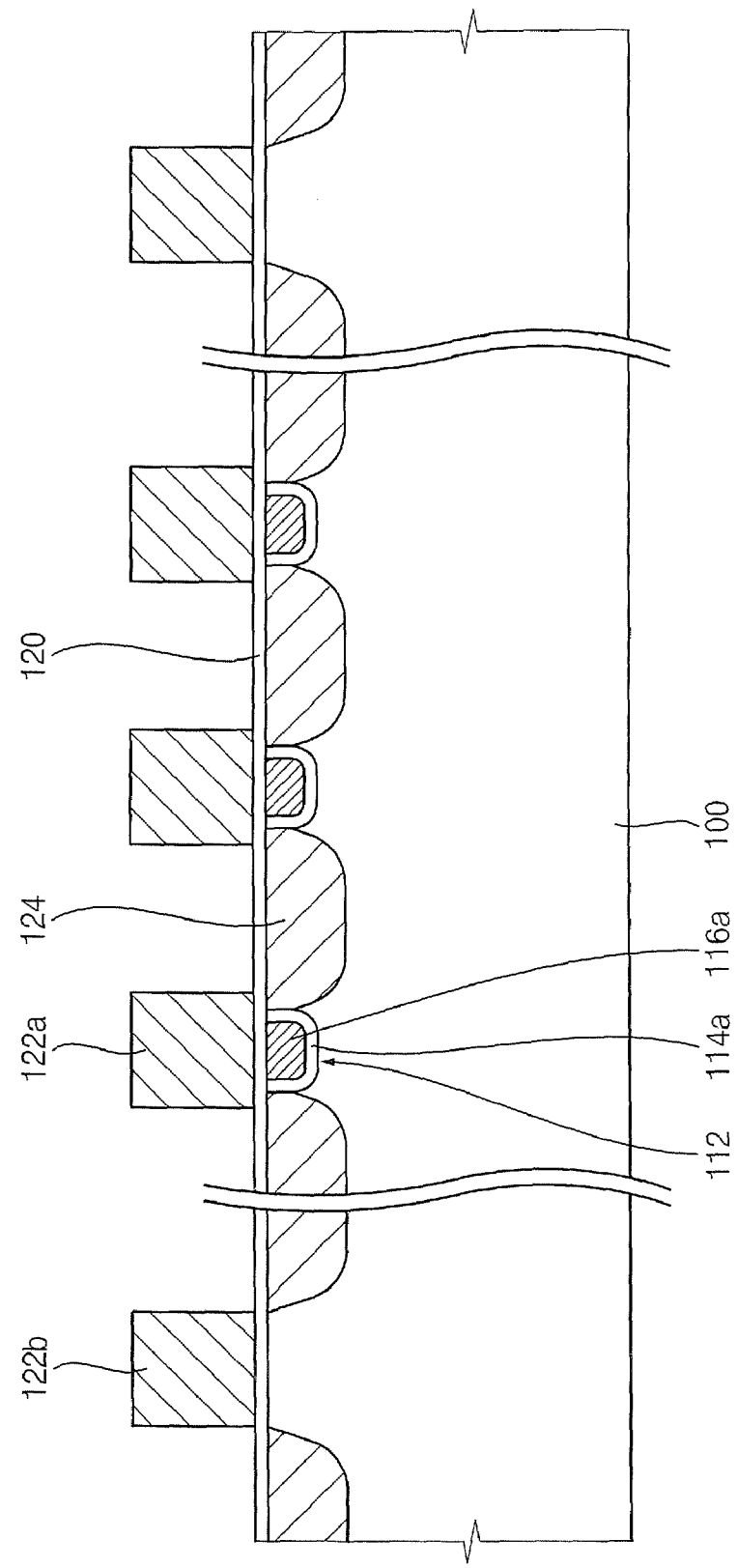

Referring to FIG. 12, a second conductive layer for forming an upper electrode is formed on the dielectric layer 120. The second conductive layer may be formed using polysilicon doped with impurities, a metal, etc.

A third hard mask (not shown) is formed on the second conductive layer, and the second conductive layer is partially removed by an etching process using the third hard mask as an etching mask to form an upper electrode 122a.

The upper electrode 122a is formed to overlap the lower electrode 116a and the resistant material layer pattern 114a. The isolation layer pattern 104 may have a linear shape extending in a first direction, and the upper electrode 122a may have a linear shape extending in a second direction that is substantially perpendicular to the first direction. Thus, the upper electrode 122a may control a plurality of the lower electrodes 116a and a plurality of the resistant material layer patterns 114a that are disposed in the second direction.

When the upper electrode 122a is formed by an etching process over the recess 112, a gate electrode 112b may be formed by the etching process on the dielectric layer 120 under which the recess 112 is not formed. The gate electrode 112b may serve as a gate electrode of MOS transistor for controlling unit cell strings.

Implanting n-type impurities into an upper portion of the substrate 100 exposed by the upper electrode 124 and the gate electrode 112b to form the impurity region 124. The impurity region 124 may make contact with a sidewall of the resistant material layer pattern 114a.

According to embodiments of the present invention, interference between cells may be reduced and a cell distribution may be improved, so that a non-volatile memory device may have improved operation characteristics compared to a conventional non-volatile memory device. Additionally, the non-volatile memory device in accordance with the present invention may be operated at low voltage and serve as a NAND flash memory device, and thus the non-volatile memory device may have a high integration degree. Furthermore, the non-volatile memory device may be formed at a low cost by a simple process.

According to embodiments of the present invention, data is programmed or erased by changing resistance, and thus interference between cells may be reduced and a cell distribution may be improved in a non-volatile memory device. Additionally, an operational voltage applied from an exterior for changing the resistance is considerably low compared to that used in a conventional memory device, which injects and emits charges by an F-N tunneling method. Therefore, additional elements such as a high voltage transistor formed at a peri/core region are not necessary.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A non-volatile memory device, comprising:
   a substrate having a recess thereon;
   a resistant material layer pattern in the recess, the resistant material layer pattern including a material having a resistance that varies according to an applied voltage;
   a lower electrode on the resistant material layer pattern in the recess;
   a dielectric layer on the substrate, the resistant material layer pattern and the lower electrode; and
   an upper electrode on the dielectric layer and overlapping the resistant material layer pattern and the lower electrode, wherein the applied voltage is applied to access the upper and lower electrodes to vary the resistance of the resistant material layer pattern.

2. The non-volatile memory device of claim 1, wherein the resistant material layer pattern is on a bottom and a sidewall of the recess.

3. The non-volatile memory device of claim 1, wherein the resistant material layer pattern includes a metal oxide.

4. The non-volatile memory device of claim 3, wherein the resistant material layer pattern comprises zirconium oxide, tantalum oxide, niobium oxide and/or strontium zirconium oxide doped with chrome.

5. The non-volatile memory device of claim 1, further comprising an impurity region formed at an upper portion of the substrate adjacent the upper electrode.

6. The non-volatile memory device of claim 5, wherein at least a portion of the impurity region contacts the resistant material layer pattern.

7. The non-volatile memory device of claim 1, further comprising an isolation layer pattern extending in a first direction at an upper portion of the substrate, the isolation layer pattern dividing the substrate into an isolation region and an active region.

8. The non-volatile memory device of claim 7, further comprising a plurality of recesses on the active region of the substrate, each of the recesses including a respective resistant material layer pattern therein having a resistance that varies according to an applied voltage, and a lower electrode on the resistant material layer pattern.

9. The non-volatile memory device of claim 8, wherein each of the respective resistant material layer patterns and lower electrodes comprises a unit cell, a plurality of unit cells configured to be electrically connected to one another in series to form a string, the device further comprising a metal-oxide-semiconductor (MOS) transistor formed at an end of the string and configured to select the string.

10. The non-volatile memory device of claim 7, wherein the isolation layer pattern is exposed by a sidewall of the recess.

11. The non-volatile memory device of claim 7, wherein the upper electrode has a linear shape extending in a second direction substantially perpendicular to the first direction.

12. The non-volatile memory device of claim 1, wherein data is programmed by applying a programming voltage to the upper electrode to reduce a resistance of the resistant material layer pattern.

13. The non-volatile memory device of claim 1, wherein data is erased by applying an erasing voltage between the upper electrode and the substrate to increase a resistance of the resistant material layer pattern.

14. The non-volatile memory device of claim 1, wherein data is read based on a current flowing through the resistant material layer pattern and the lower electrode at a portion of the substrate adjacent to the resistant material layer pattern.

15. The non-volatile memory device of claim 1, wherein the lower electrode extends into the recess.

16. The non-volatile memory device of claim 1, wherein the upper electrode is on a side of the dielectric layer that is opposite the resistant material layer pattern and the lower electrode.

17. A method of operating a non-volatile memory device including a substrate having a plurality of cells, wherein each cell comprises a recess on the substrate, a resistant material layer pattern including a material whose resistance varies according to an applied voltage in the recess, a lower electrode on the resistant material layer pattern and in the recess, a dielectric layer on the substrate, the resistant material layer pattern and the lower electrode, and an upper electrode overlapping the resistant material layer pattern and the lower electrode on the dielectric layer, the method comprising:

programming data in a cell by applying a programming voltage to the upper electrode to reduce a resistance of the resistant material layer pattern;

erasing data in a cell by applying an erasing voltage between the upper electrode and the substrate to increase a resistance of the resistant material layer pattern; and reading data stored in a cell based on a current flowing through the resistant material layer pattern and the lower electrode at a portion of the substrate adjacent to the resistant material layer pattern.

18. The method of claim 17, wherein a plurality of the cells is disposed in a direction to form a string, erasing the data in the cell is collectively performed by applying an erasing voltage to the substrate and applying a voltage of 0V to the upper electrode.

19. The method of claim 17, wherein reading the data stored in the cell is performed by determining whether the measured current exceeds a predetermined value, and wherein the cell is considered to be in a programmed state when the measured current exceeds the predetermined value, and is considered to be in an erased state when the measured current is less than the predetermined value.

20. The method of claim 17, wherein the lower electrode extends into the recess.

21. The method of claim 17, wherein the upper electrode is on a side of the dielectric layer that is opposite the resistant material layer pattern and the lower electrode.

* * * * *